(12) United States Patent
Takita et al.

(10) Patent No.: US 12,126,138 B2
(45) Date of Patent: Oct. 22, 2024

(54) OPTICAL SEMICONDUCTOR DEVICE AND SEMICONDUCTOR LIGHT-EMITTING DEVICE

(71) Applicant: Lumentum Japan, Inc., Kanagawa (JP)

(72) Inventors: Hayato Takita, Yokohama (JP); Atsushi Nakamura, Komoro (JP); Shunya Yamauchi, Sagamihara (JP); Hideaki Asakura, Sagamihara (JP)

(73) Assignee: Lumentum Japan, Inc., Kanagawa (JP)

( * ) Notice: Subject to any disclaimer, the term of this patent is extended or adjusted under 35 U.S.C. 154(b) by 866 days.

(21) Appl. No.: 17/214,580

(22) Filed: Mar. 26, 2021

(65) Prior Publication Data

US 2022/0115842 A1    Apr. 14, 2022

(30) Foreign Application Priority Data

Oct. 13, 2020 (JP) ................. 2020-172696
Dec. 17, 2020 (JP) ................. 2020-209512

(51) Int. Cl.
*H01S 5/227* (2006.01)
*H01S 5/02315* (2021.01)
(Continued)

(52) U.S. Cl.
CPC .......... *H01S 5/227* (2013.01); *H01S 5/02315* (2021.01); *H01S 5/02345* (2021.01);
(Continued)

(58) Field of Classification Search
CPC .......... H01S 5/227–2277; H01S 5/0425–0428; H01S 5/0265
See application file for complete search history.

(56) References Cited

U.S. PATENT DOCUMENTS

| | | | |
|---|---|---|---|
| 5,084,894 A * | 1/1992 | Yamamoto | H01S 5/12 372/50.22 |
| 5,757,027 A * | 5/1998 | Kuchta | G01R 31/2822 372/50.1 |

(Continued)

FOREIGN PATENT DOCUMENTS

| | | |
|---|---|---|
| JP | 2006128545 A | 5/2006 |
| JP | 2012019053 A | 1/2021 |

*Primary Examiner* — Sean P Hagan
(74) *Attorney, Agent, or Firm* — Harrity & Harrity, LLP

(57) ABSTRACT

An optical semiconductor device includes a semiconductor substrate with a protrusion that forms a lower end portion of a mesa stripe structure in a stripe shape extending in a first direction; a multi-quantum well layer in a stripe shape extending in the first direction on the protrusion, wherein the multi-quantum well layer forms an intermediate portion of the mesa stripe structure; a semiconductor layer in a stripe shape extending in the first direction on the intermediate portion, wherein the semiconductor layer forms an upper end portion of the mesa stripe structure; and a semi-insulating semiconductor layer in contact with side surfaces of the mesa stripe structure on both sides in a second direction perpendicular to the first direction. The optical semiconductor device may include a first electrode on a surface of the semiconductor substrate and/or a second electrode on the upper end surface of the mesa stripe structure.

20 Claims, 18 Drawing Sheets

(51) Int. Cl.
   *H01S 5/02345*   (2021.01)
   *H01S 5/0239*    (2021.01)
   *H01S 5/026*     (2006.01)
   *H01S 5/042*     (2006.01)
   *H01S 5/12*      (2021.01)
   *H01S 5/22*      (2006.01)

(52) U.S. Cl.
   CPC .......... *H01S 5/0239* (2021.01); *H01S 5/0265* (2013.01); *H01S 5/04256* (2019.08); *H01S 5/12* (2013.01); *H01S 5/2224* (2013.01); *H01S 2301/176* (2013.01)

(56) References Cited

U.S. PATENT DOCUMENTS

| | | | |
|---|---|---|---|
| 2002/0167983 A1* | 11/2002 | Marutani | H01S 5/1082 372/46.01 |
| 2006/0008194 A1 | 1/2006 | Kagaya et al. | |
| 2007/0297475 A1* | 12/2007 | Sasada | B82Y 20/00 372/44.01 |
| 2012/0008895 A1 | 1/2012 | Sumi et al. | |
| 2012/0230361 A1* | 9/2012 | Adachi | H01S 5/12 372/45.01 |
| 2014/0334512 A1* | 11/2014 | Kwon | H01S 5/0427 372/45.01 |
| 2016/0365929 A1* | 12/2016 | Nakamura | H01S 5/12 |
| 2021/0257808 A1* | 8/2021 | Otani | H01S 5/02345 |

* cited by examiner

OPTICAL SEMICONDUCTOR DEVICE AND SEMICONDUCTOR LIGHT-EMITTING DEVICE

CROSS-REFERENCE TO RELATED APPLICATIONS

The present application claims priority from Japanese patent applications JP2020-172696 filed on Oct. 13, 2020 and JP2020-209512 filed on Dec. 17, 2020, the contents of which are hereby expressly incorporated by reference herein.

TECHNICAL FIELD

The disclosure relates to an optical semiconductor device and a semiconductor light-emitting device.

BACKGROUND

With the widespread use of communication devices, such as mobile devices that communicate via the Internet, an optical module may be required to have higher speeds and higher capacities. An electro-absorption (EA) modulator may be used for modulating continuous light emitted from an oscillator, such as a semiconductor laser. In some cases, the EA modulator has a buried hetero structure and/or utilizes a wire for transmitting electric signals to or from the EA modulator.

To improve high-frequency characteristics of the EA modulator, parasitic capacitance associated with the EA modulator should be minimized. Accordingly, a greater thickness of the buried hetero structure can be effective, but its effect can be limited.

SUMMARY

An optical semiconductor device includes: a semiconductor substrate with a protrusion, wherein the protrusion forms a lower end portion of a mesa stripe structure in a stripe shape extending in a first direction; a multi-quantum well layer in a stripe shape extending in the first direction on the protrusion, wherein the multi-quantum well layer forms an intermediate portion of the mesa stripe structure; a semiconductor layer in a stripe shape extending in the first direction on the intermediate portion, wherein the semiconductor layer forms an upper end portion of the mesa stripe structure; a semi-insulating semiconductor layer in contact with side surfaces of the mesa stripe structure on both sides in a second direction perpendicular to the first direction; a first electrode on a surface, opposite to the protrusion, of the semiconductor substrate; a second electrode including a mesa electrode on the upper end surface of the mesa stripe structure, wherein the second electrode includes a lead-out electrode extending in the second direction from the mesa electrode, wherein the second electrode includes a pad electrode connected to the lead-out electrode; and a metal film including a first portion electrically connected to an upper surface of the semiconductor substrate next to the protrusion in the second direction and exposed from the semi-insulating semiconductor layer, wherein the metal film includes a second portion positioned next to and in no contact with the pad electrode and continuously integrated with at least part of the first portion.

A semiconductor light-emitting device comprising the optical semiconductor device and a carrier on which the optical semiconductor device is mounted.

DETAILED DESCRIPTION

Figure 1:
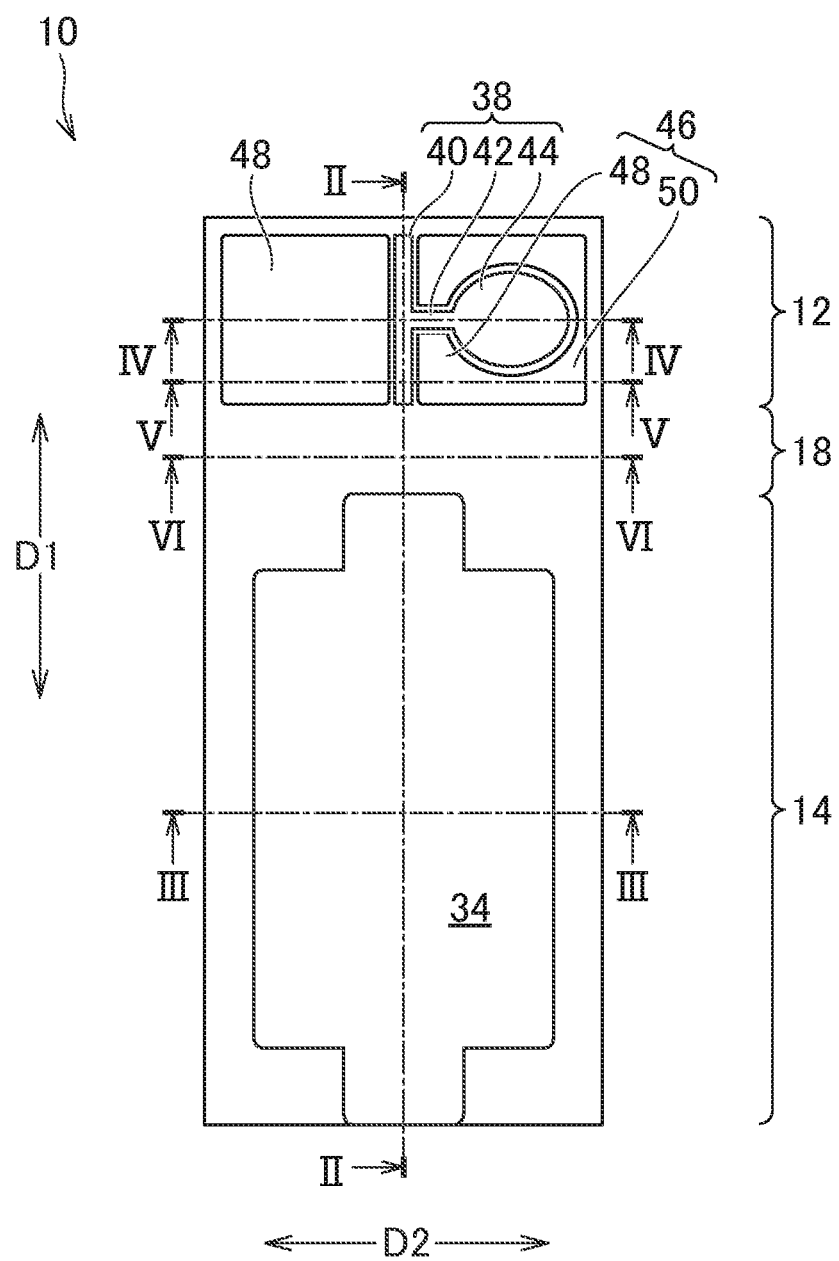
FIG. 1 is a plan view of an example optical semiconductor described herein.

Hereinafter, some implementations will be described specifically and in detail with reference to drawings. In all the drawings, the members with the same reference numerals have the identical or same feature and their repetitive description will be omitted. Sizes of figures do not always comply with magnification.

Figure 2:
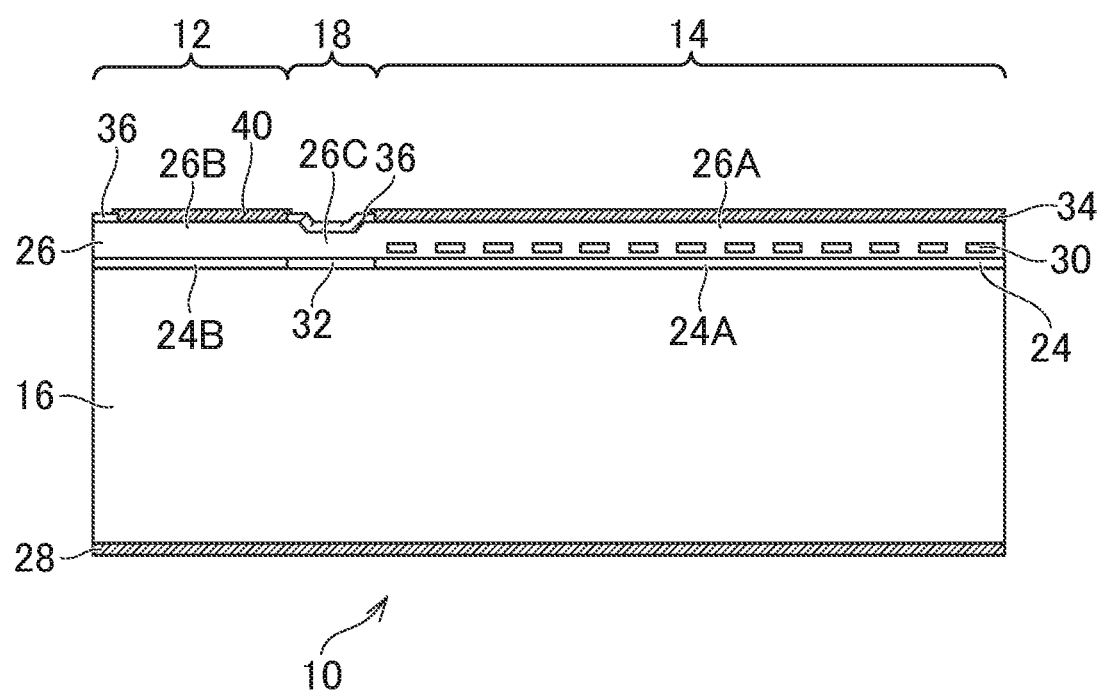
FIG. 2 is a II-II cross-sectional view of the example optical semiconductor device shown in FIG. 1.

FIG. 1 is a plan view of an example optical semiconductor device. FIG. 2 is a II-II cross-sectional view of the example optical semiconductor device shown in FIG. 1. An optical semiconductor device 10 may be a modulator integrated semiconductor laser that includes a semiconductor laser 14 and a modulator 12. The semiconductor laser 14, a connecting waveguide 18, and the modulator 12 may be integrated in a semiconductor substrate 16 serving as a base. The semiconductor substrate 16 may comprise a semiconductor with a first conductivity type (e.g., n-type).

Figure 3:
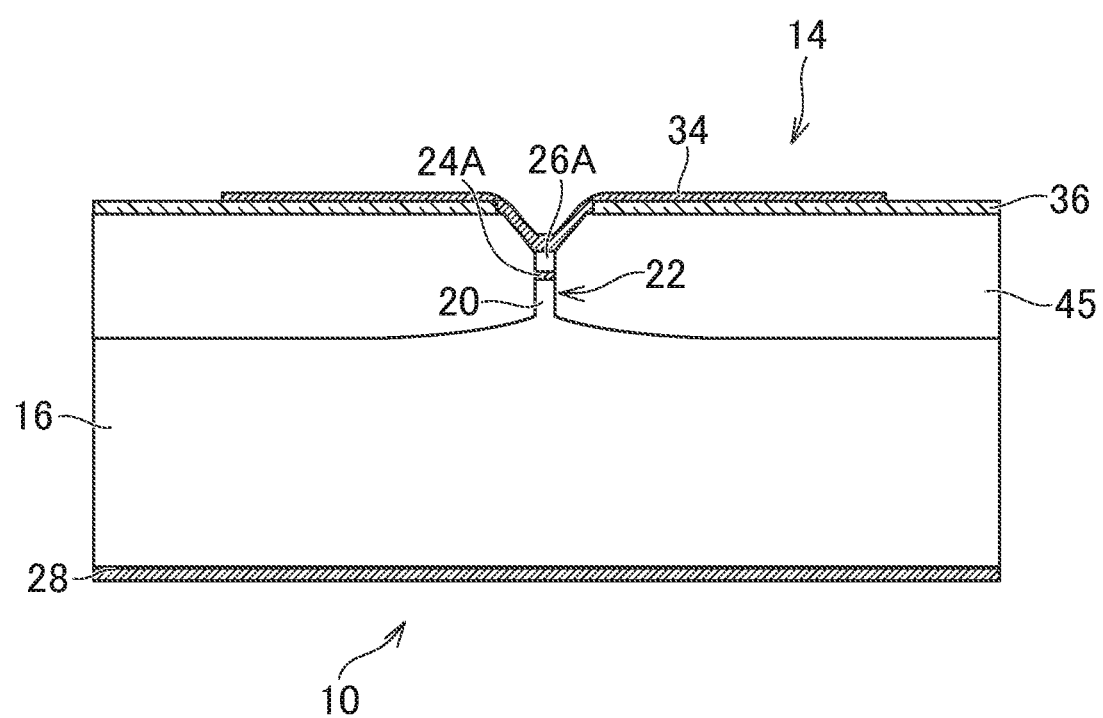
FIG. 3 is a cross-sectional view of the example optical semiconductor device shown in FIG. 1.
Figure 4:
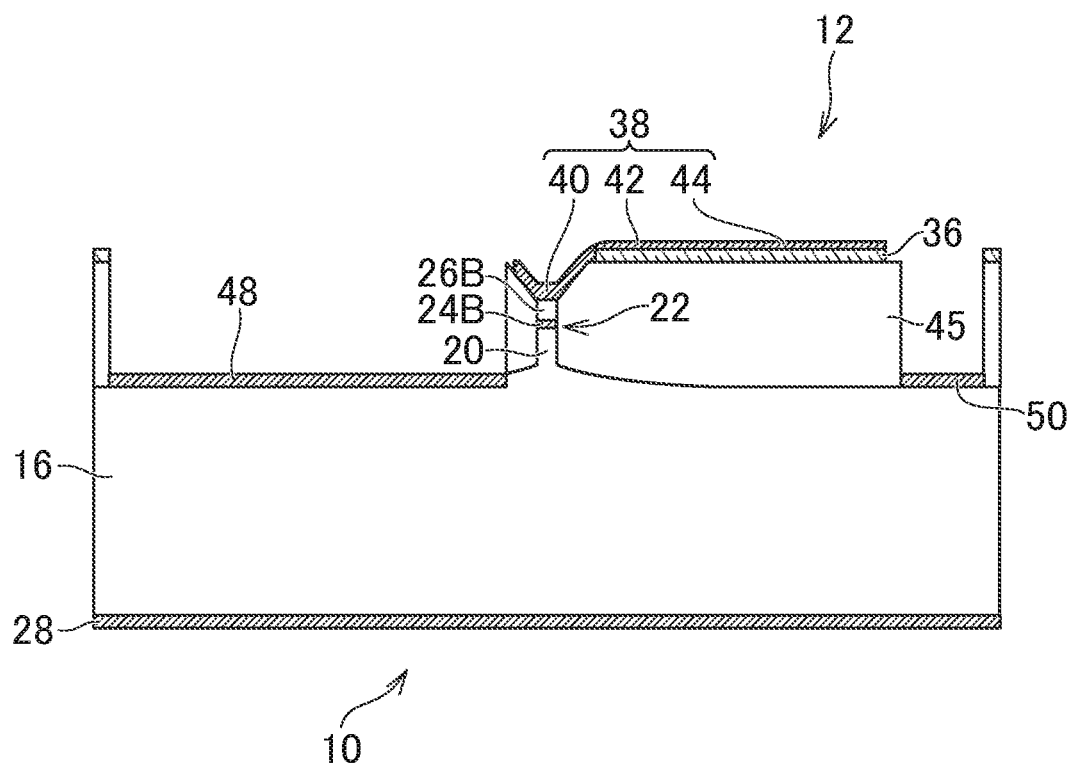
FIG. 4 is a IV-IV cross-sectional view of the example optical semiconductor device shown in FIG. 1.
Figure 5:
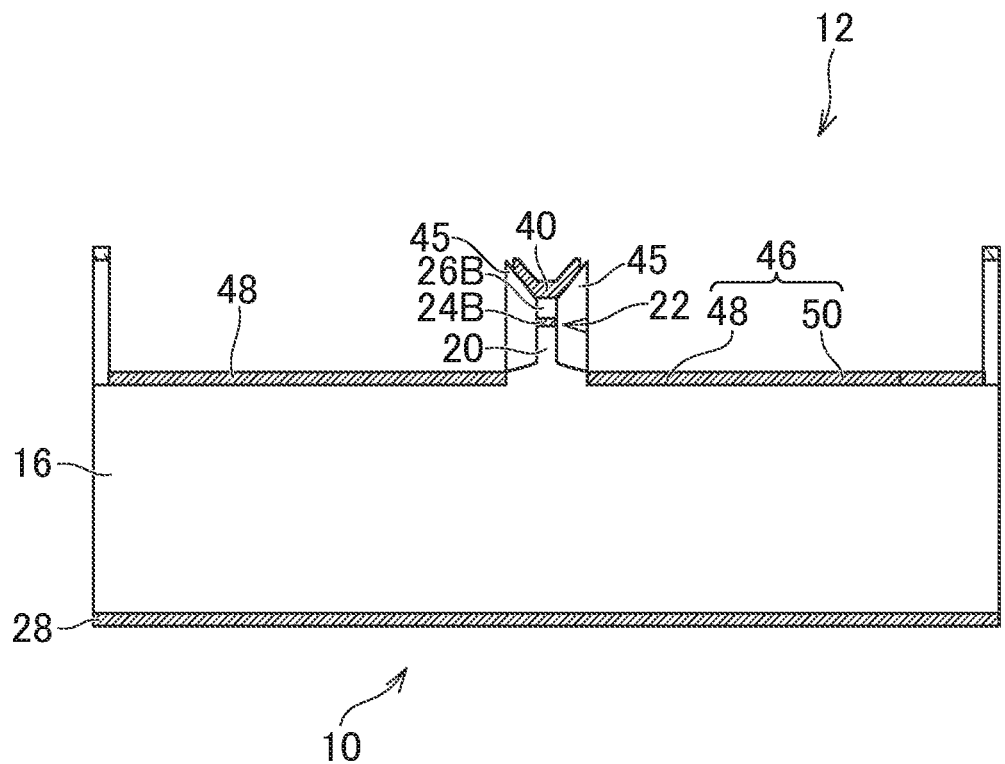
FIG. 5 is a V-V line sectional view of the example optical semiconductor device shown in FIG. 1.
Figure 6:
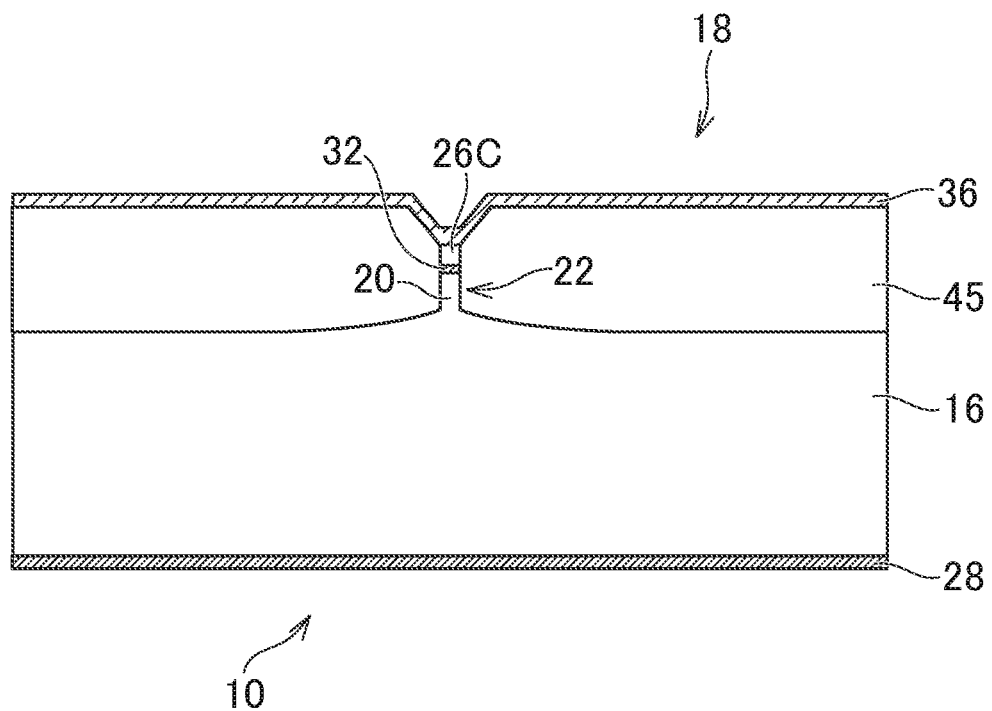
FIG. 6 is a VI-VI cross-sectional view of the example optical semiconductor device shown in FIG. 1.

FIG. 3 is a cross-sectional view of the optical semiconductor device 10 shown in FIG. 1. FIG. 4 is a IV-IV cross-sectional view of the optical semiconductor device 10 shown in FIG. 1. FIG. 5 is a V-V line sectional view of the optical semiconductor device 10 shown in FIG. 1. FIG. 6 is a VI-VI cross-sectional view of the optical semiconductor device 10 shown in FIG. 1.

The semiconductor substrate 16 (e.g., an n-InP substrate) may include a protrusion 20. The protrusion 20 may form a lower end portion of a mesa stripe structure 22 extending in a stripe shape in a first direction D1. The mesa stripe structure 22 may extend from the semiconductor laser 14 to the modulator 12.

The optical semiconductor device 10 may have a multi-quantum well layer 24 (24A, 24B) in the semiconductor laser 14 and the modulator 12. The multi-quantum well layer 24 may extend in a stripe shape in the first direction D1 on the protrusion 20. The multi-quantum well layer 24 may form an intermediate portion of the mesa stripe structure 22.

The optical semiconductor device 10 may include a semiconductor layer 26 (26A, 26B, 26C). The semiconductor layer 26 may comprise a semiconductor with a second conductivity type (e.g., p-type). The semiconductor layer 26 (e.g., an p-InP layer) may extend in a stripe shape in the first direction D1 on the intermediate portion of the mesa stripe structure 22. The semiconductor layer 26 may form an upper end portion of the mesa stripe structure 22.

The optical semiconductor device 10 may include a first electrode 28. The first electrode 28 may be located on a surface (e.g., a back surface) of the semiconductor substrate 16 that is opposite the protrusion 20. The first electrode 28 may be positioned on the surface of the semiconductor substrate 16, such that first electrode 28 covers a substantial portion of the surface. The first electrode 28 may be have a same potential as the semiconductor substrate 16. Another layer may be interposed between the first electrode 28 and the semiconductor substrate 16 (e.g., a semiconductor with the same conductivity type as the semiconductor substrate 16).

Part of the mesa stripe structure 22 may form the semiconductor laser 14. The semiconductor laser 14 may be configured to emit continuous light toward the modulator 12. In some implementations, a dielectric high reflection film (not shown) may be formed, at the back of the semiconductor laser 14 (e.g., opposite the modulator 12), on a rear end surface of the optical semiconductor device 10.

The semiconductor laser 14 may be at least one of a distributed feedback (DFB) laser, a Fabry-Perot (FP) laser, a distributed bragg reflector (DBR) laser, or a distributed reflector (DR) laser, and may be configured to oscillate in a 1.3 μm band or a 1.55 μm band.

The semiconductor laser 14 may include a multi-quantum well layer 24A and a diffraction grating layer 30. The semiconductor layer 26A (e.g., a cladding layer) may be disposed between the gratings of the diffraction grating layer 30. In some implementations, one or more optical confinement layers (not shown) may be disposed above and below the multi-quantum well layer 24A, respectively. A contact layer (not shown) may be disposed on the semiconductor layer 26A.

Part of the mesa stripe structure 22 may form the modulator 12. The modulator 12 may be an electro-absorption modulator (an EA modulator) or a Mach-Zehnder modulator (an MZ modulator). Optical confinement layers (not shown) may be provided above and below the multi-quantum well layer 24B, respectively. The multi-quantum well layer 24B may be configured to absorb light (e.g., emitted light) corresponding to an oscillation wavelength of the semiconductor laser 14 (e.g., when an electric field is applied).

A semiconductor layer 26B (cladding layer) may be disposed on the multi-quantum well layer 24B. The semiconductor layer 26B may be a same material as the semiconductor layer 26A, or may be a different material.

Continuous light that falls incident on the modulator 12 may be intensity modulated by the modulator 12 and converted into a modulated optical signal, such as binary or quaternary. The modulated light signal emitted from the modulator 12 may be emitted from a front end surface. Another structure (e.g. a window structure, such as an insulating InP structure) may be disposed near the front end surface. In some implementations, a dielectric anti reflection film (not shown) may be formed on the front end surface.

Part of the mesa stripe structure 22 may form the connecting waveguide 18. The connecting waveguide 18 may optically connect the modulator 12 and the semiconductor laser 14. The modulator 12, the semiconductor laser 14, and the connecting waveguide 18 may be monolithically integrated to allow the modulator 12 and the semiconductor laser 14 to optically connect. The semiconductor laser 14, the connecting waveguide 18, and the modulator 12 may be optically connected in series. The connecting waveguide 18 may be configured to transmit the emitted light from the semiconductor laser 14 to the modulator 12.

The connecting waveguide 18 may include a core layer 32 that is continuous to the multi-quantum well layer 24. The core layer 32 may comprise a semiconductor and/or a layer (e.g., a bulk layer) that does not absorb the emitted light from the semiconductor laser 14. In some implementations, optical confinement layers may be disposed above and below the core layer 32, respectively.

A semiconductor layer 26C (e.g., a cladding layer) may be disposed on the core layer 32. The semiconductor layer 26C may be a same material as the semiconductor layer 26A of the semiconductor laser 14 or may be a different material. In some implementations, as shown in FIG. 2, the semiconductor layer 26C may be thinner than the semiconductor layer 26A. This may increase an electrical isolation between the modulator 12 and the semiconductor laser 14.

The semiconductor laser 14 may include a laser electrode 34 on the mesa stripe structure 22. The laser electrode 34 may be electrically and physically connected to a contact layer (not shown). Continuous light may be oscillated by an electric field applied (a current injected) between the laser electrode 34 and the first electrode 28. In some implementations, a composition wavelength of the multi-quantum well layer 24A and the grating space of the diffraction grating layer 30 may be configured to oscillate in the 1.3 μm band. As shown in FIG. 6, in the connecting waveguide 18, there may be no electrode facing the first electrode 28, and the entire structure, including the mesa stripe structure 22, may be covered with an oxide film 36.

The modulator 12 may have a second electrode 38. The second electrode 38 may comprise a uniform material and/or a uniform structure. The second electrode 38 may include a mesa electrode 40 located on an upper end surface of the mesa stripe structure 22. The mesa electrode 40 may have a rectangular shape. The mesa electrode 40 may be disposed on the semiconductor layer 26B and may be electrically and physically connected to a contact layer (not shown). The mesa electrode 40 and the semiconductor layer 26B (cladding layer) may have a same potential. Another layer may be interposed between the mesa electrode 40 and the semiconductor layer 26B (e.g., a semiconductor with the same conductivity type as the semiconductor layer 26B). By applying a reverse bias between the mesa electrode 40 and the first electrode 28, the modulator 12 may absorb light.

The second electrode 38 may include a lead-out electrode 42 that extends from the mesa electrode 40 in a second direction D2. The lead-out electrode 42 may have a width smaller in the first direction D1 than that of the mesa electrode 40. The second electrode 38 may include a pad electrode 44 connected to the lead-out electrode 42. The pad electrode 44 may have a greater width in the first direction D1 than that of the lead electrode 42. A planar shape of the pad electrode 44 may be any of a circle, a square, a round square, and an ellipse.

The optical semiconductor device 10 may have a semi-insulating semiconductor layer 45 (e.g., a Fe—InP layer). The semi-insulating semiconductor layer 45 may be disposed on both sides of the mesa stripe structure 22, but not on an upper surface of the mesa stripe structure 22. The semi-insulating semiconductor layer 45 may be in contact with both side surfaces of the mesa stripe structure 22 in the second direction D2 and perpendicular to the first direction D1. The semi-insulating semiconductor layer 45 may be positioned higher than the mesa stripe structure 22 and may be positioned higher than the semiconductor layer 26, for example. In the semiconductor laser 14 and the connecting waveguide 18, regions on both sides of the mesa stripe structure 22 may be embedded with the semi-insulating semiconductor layer 45.

The semi-insulating semiconductor layer 45, as shown in FIG. 4, may be disposed below the lead-out electrode 42 and the pad electrode 44. The oxide film 36 may be disposed between the semi-insulating semiconductor layer 45 and the second electrode 38 (e.g., except for the mesa electrode 40). The semi-insulating semiconductor layer 45, below the lead-out electrode 42 and the pad electrode 44, may be positioned higher than an adjacent position of the mesa stripe structure 22. When the semi-insulating semiconductor layer 45 is present, the lead-out electrode 42 and the pad electrode 44 may be separated from the semiconductor substrate 16 (and/or the first electrode 28). Thus, a parasitic capacitance of the lead electrode 42 and the pad electrode 44 may be reduced.

In the modulator 12, except when below the lead-out electrode 42 and the pad electrode 44, the semi-insulating semiconductor layer 45 may be positioned in a region adjacent to the mesa stripe structure 22 (FIG. 5). That is, the semi-insulating semiconductor layer 45, may be positioned in a region separated from the mesa stripe structure 22, and may thereby avoid overlapping with the semiconductor substrate 16. Thus, with an air layer of low dielectric constant interposed between the mesa electrode 40 and the semiconductor substrate 16, a parasitic capacitance of the mesa electrode 40 may be reduced. The reduction of the parasitic capacitance enables a wider band to be achieved. In some cases, the semi-insulating semiconductor layer 45 can be eliminated to widen the band, but the multi-quantum well layer 24 would be exposed, which affects its reliability. Implementations described herein enable a wider bandwidth while maintaining reliability of the semiconductor layer 45.

The optical semiconductor device 10 (modulator 12) may have a metal film 46. The metal film 46 may be formed on a region, of the semiconductor substrate 16, where the semi-insulating semiconductor layer 45 is not present. When the metal film 46 is present, the semiconductor substrate 16 is not in contact with air, which improves a reliability of the semiconductor substrate 16.

The metal film 46 may include a first portion 48. As shown in FIG. 5, the first portion 48 may be connected to (in contact with) the upper surface of the semiconductor substrate 16 and/or next to the protrusion 20 in the second direction D2. As shown in FIG. 1, a first portion 48, of a pair of first portions 48, may be positioned adjacent to the lead-out electrode 42 in the first direction D1. The pair of first portions 48 may be located on both sides of the protrusion 20 in the second direction D2. A first portion 48 may be exposed from the semi-insulating semiconductor layer 45. That is, there may be no semi-insulating semiconductor layer 45 on the first portion 48. Therefore, a parasitic capacitance of the mesa electrode 40 can be reduced.

The metal film 46 includes a second portion 50. The second portion 50 may be continuous and integrated with one (on the right side in FIG. 1) of the pair of first portions 48. The second portion 50 may be continuously integrated with at least part of the first portion 48. The second portion 50 may be positioned next to but in no contact with the pad electrode 44. The second portion 50 may be positioned adjacent to the pad electrode 44 in the first direction D1 and the second direction D2. in some implementations, as show in FIG. 5, there may be no semi-insulating semiconductor layer 45 on the second portion 50.

Figure 7:
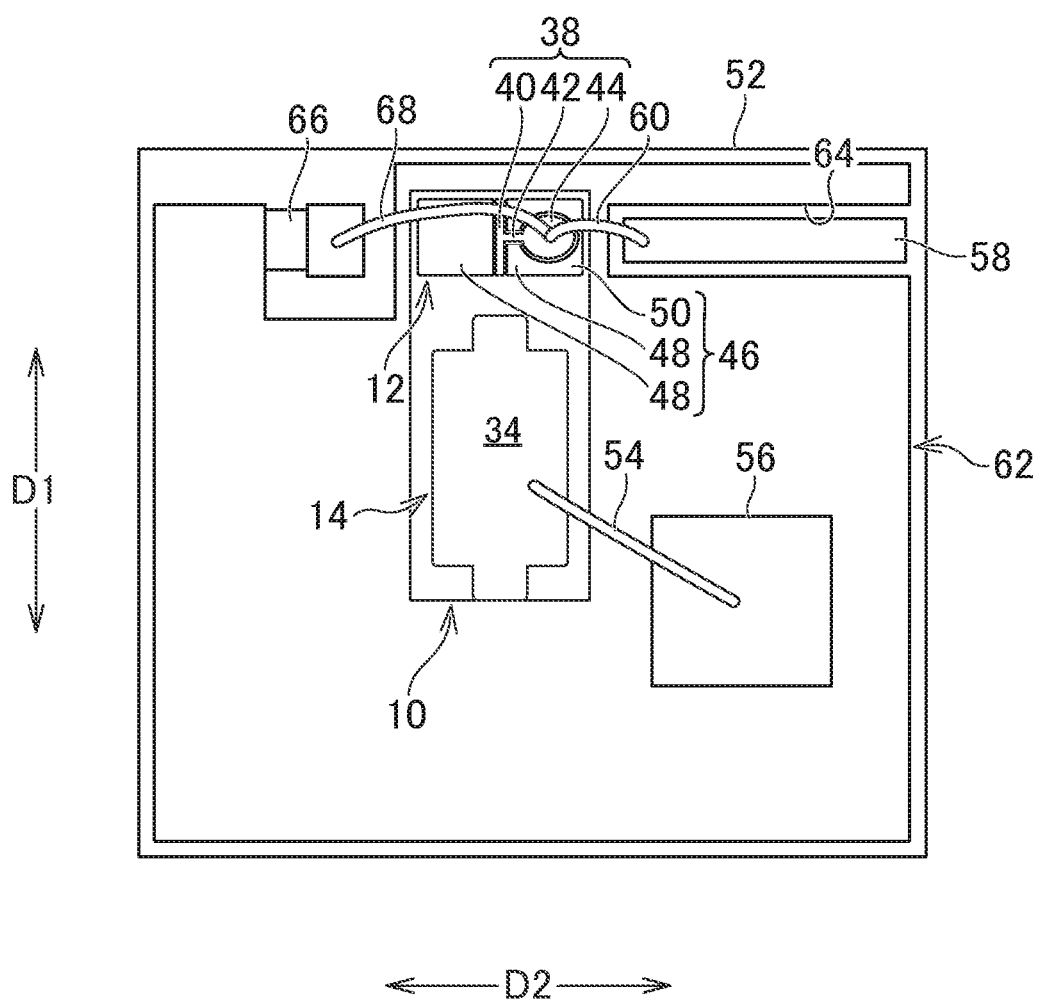
FIG. 7 is a plan view of an example semiconductor light-emitting device described herein.

FIG. 7 is a plan view of the example semiconductor light-emitting device. The example semiconductor light-emitting device may have a carrier 52 (e.g., a ceramic substrate). The example optical semiconductor device 10 may be mounted on the carrier 52. The semiconductor laser 14 may be driven by a direct current input from the outside. The direct current may be injected through the power supply wire 54. The power supply wire 54 may connect the upper electrode of the capacitor 56 and the laser electrode 34.

The carrier 52 may be equipped with a signal line 58. The signal line 58 may be configured to transmit high frequency electrical signals. The signal line 58 may be electrically connected to the pad electrode 44 of the optical semiconductor device 10 (modulator 12) with the first signal wire 60 extending above the second portion 50 of the metal film 46.

The carrier 52 may be equipped with a ground pattern 62. The ground pattern 62 may be connected to a reference potential (e.g., a ground potential). The lower electrode of the capacitor 56 may be electrically connected to and opposed to the ground pattern 62. The ground pattern 62 may have a recess 64 and the signal line 58 may be disposed inside the recess 64. Thus, the signal line 58 may serve as a coplanar line or a grounded coplanar line.

The ground pattern 62 may be connected to the first electrode 28 (shown in FIG. 2) of the optical semiconductor device 10 (modulator 12). Solder (not shown) may be used for the connection. The ground pattern 62 may be electrically connected to one end of the termination resistor 66. The termination resistor 66 may be mounted on the carrier 52; its resistance value may be, for example, 50Ω. The pad electrode 44 of the optical semiconductor device 10 (modulator 12) may be electrically connected to the other end of the termination resistor 66 with a second signal wire 68. The modulator 12 and the termination resistor 66 may be connected in parallel.

When no semi-insulating semiconductor layer 45 is disposed above the first portion 48 of the metal film 46 (shown in FIG. 5), a parasitic capacitance of the mesa electrode 40 may be reduced. This may be the effect of both the pair of first portions 48. Also, the first portion 48 (shown on the left side in FIG. 7), above which the second signal wire 68 extends, may contribute to reduction of inductance of the second signal wire 68. This may be similar to the effect of the second portion 50.

Next, an effect of the second portion 50 of the metal film 46 is described. The first signal wire 60 may have the inductance increased due to being away from the ground pattern 62, whereby the optical/electrical response characteristics (high-frequency characteristics) has conventionally deteriorated.

In this implementation, the second portion 50 of the metal film 46 may be disposed below the first signal wire 60. The metal film 46 may be electrically connected to the semiconductor substrate 16 (shown in FIG. 5). Furthermore, the semiconductor substrate 16 may be connected to the ground pattern 62 through the first electrode 28. Therefore, the second portion 50 of the metal film 46 may be at the ground potential.

The first signal wire 60 may straddle the second portion 50 of the metal film 46. A region closest to the first signal wire 60 and having the ground potential may be the metal film 46. The second portion 50 of the metal film 46 may surround the pad electrode 44. Therefore, many ground potential areas may be arranged around the first signal wire 60.

When the metal film 46 is not present, there may be no area on the surface of the modulator 12 to become a ground potential, which may cause inductance to increase. In contrast, when the metal film 46 is on the surface side of the modulator 12, the metal film 46 may spread the electric field between the first signal wire 60 and the metal film 46, which may suppress an increase in inductance. In some implementations, the metal film 46 may suppress an increase in inductance more than the oxide film 36. This may be because of a difference in resistance between the oxide film 36 and the metal film 46. The materials of the metal film 46 may be Ti/Pt/Au in order from the semiconductor substrate 16. The mesa electrode 40 and the laser electrode 34 may also have this configuration.

As described above, by narrowing the semi-insulating semiconductor layer 45 on both sides of the mesa stripe structure 22, and by placing the metal film 46 electrically connected to the semiconductor substrate 16, reduction of the parasitic capacitance and reduction of the inductance may be obtained. This causes the modulator 12 to have optimal high-frequency characteristics.

In some implementations, the metal film 46 may be at the ground potential, and may not be in direct contact with the upper surface of the semiconductor substrate 16. For example, there may be a semiconductor buffer layer (not shown) between the metal film 46 and the semiconductor substrate 16, but the semiconductor buffer layer is a semiconductor with the first conductivity type. Further, the semi-insulating semiconductor layer 45 that is on both ends of the optical semiconductor device 10, in the second direction D2, may be removed. Alternatively, the metal film 46 may be spread to the both ends of the optical semiconductor device 10.

In some implementations, the first conductivity type of the semiconductor substrate 16 may be n-type, and the second conductivity type of the semiconductor layer 26 (e.g., the cladding layer) may be p-type, but the polarity may be reversed. The semiconductor substrate 16 may be a semiconductor layer laminated on an insulating substrate.

Figure 8:
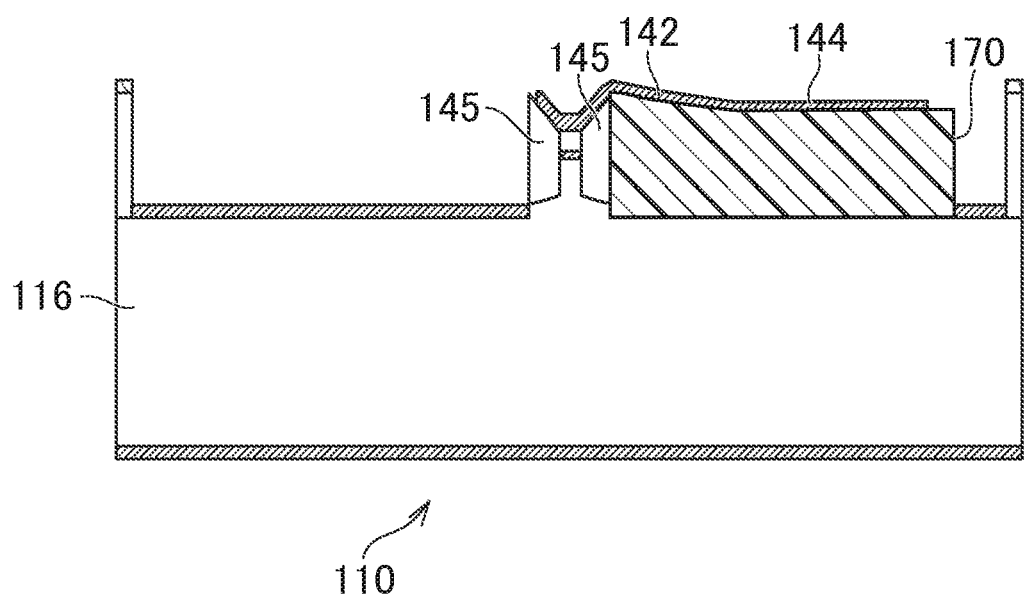
FIG. 8 is a cross-sectional view of an example optical semiconductor device.

FIG. 8 is a cross-sectional view of an example optical semiconductor device. An optical semiconductor device 110 may include a resin layer 170 (e.g., a polyimide layer) interposed between the lead electrode 142 and the pad electrode 144 and the semiconductor substrate 116. The resin layer 170 may have a low dielectric constant as compared to the semi-insulating semiconductor layer 145, thereby further reducing a parasitic capacitance of the pad electrode 144 and the lead-out electrode 142. What is described above in relation to FIGS. 1-7 is applicable to FIG. 8.

Figure 9:
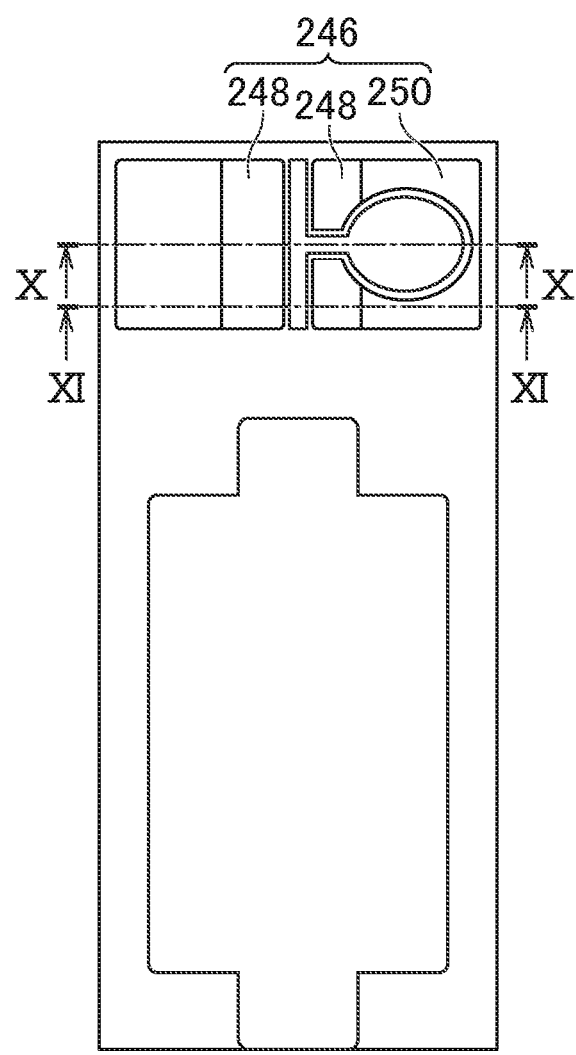
FIG. 9 is a plan view of an example optical semiconductor device.
Figure 10:
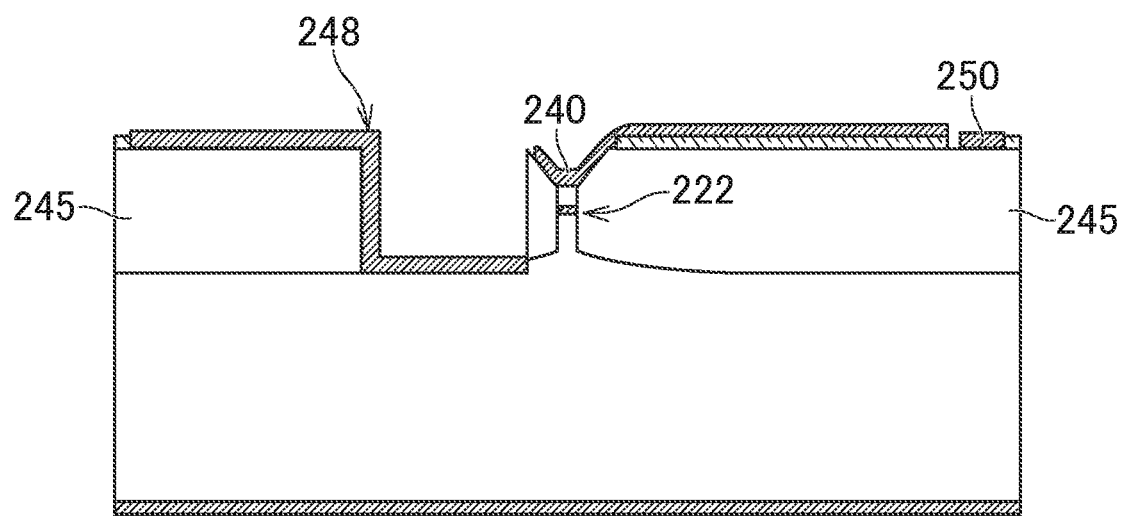
FIG. 10 is a X-X sectional view of the example optical semiconductor device shown in FIG. 9.
Figure 11:
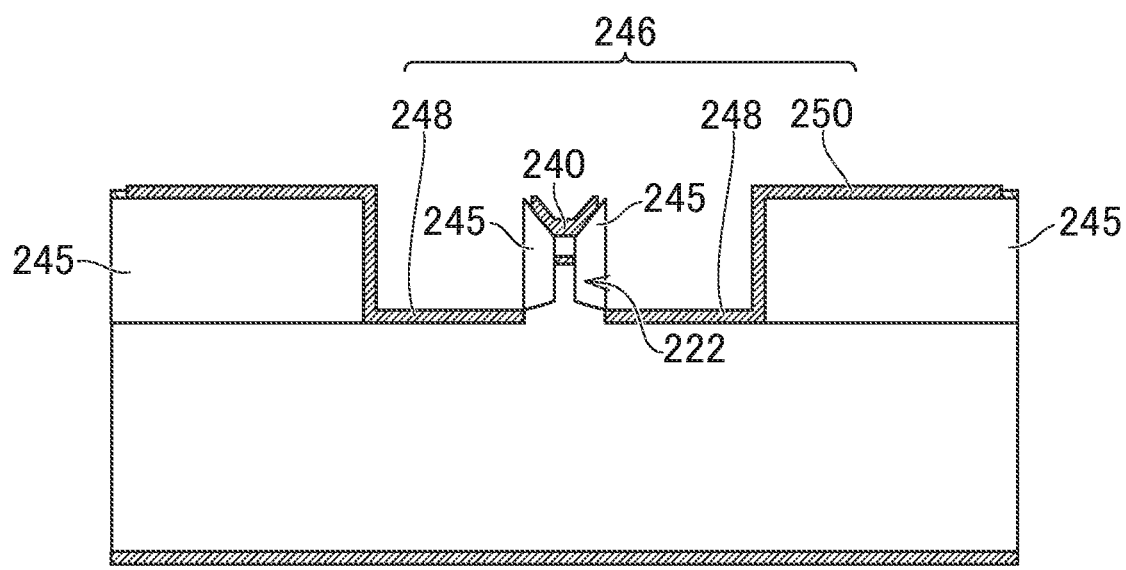
FIG. 11 is an XI-XI cross-sectional view of the example optical semiconductor device in shown FIG. 9.

FIG. 9 is a plan view of an example optical semiconductor device. FIG. 10 is a X-X sectional view of the example optical semiconductor device shown in FIG. 9. FIG. 11 is an XI-XI cross-sectional view of the example optical semiconductor device shown in FIG. 9. What is described above in relation to FIGS. 1-8 is applicable to FIGS. 9-11.

A semi-insulating semiconductor layer 245 may be disposed under at least part of a second portion 250 of a metal film 246. This allows the second portion 250 to be closer to the first signal wire 60 (shown in FIG. 7), further reducing inductance.

The semi-insulating semiconductor layer 245 may be disposed below part of one of the pair of first portions 248 (that is separate from the second portion 250). Thus, the first portion 248 may be closer to the second signal wire 68 (shown in FIG. 7), thereby reducing inductance. However, the semi-insulating semiconductor layer 245 may be discontiguous to a mesa stripe structure 222, and may be separated from the mesa stripe structure 222, to reduce parasitic capacitance of the mesa electrode 240.

Figure 12:
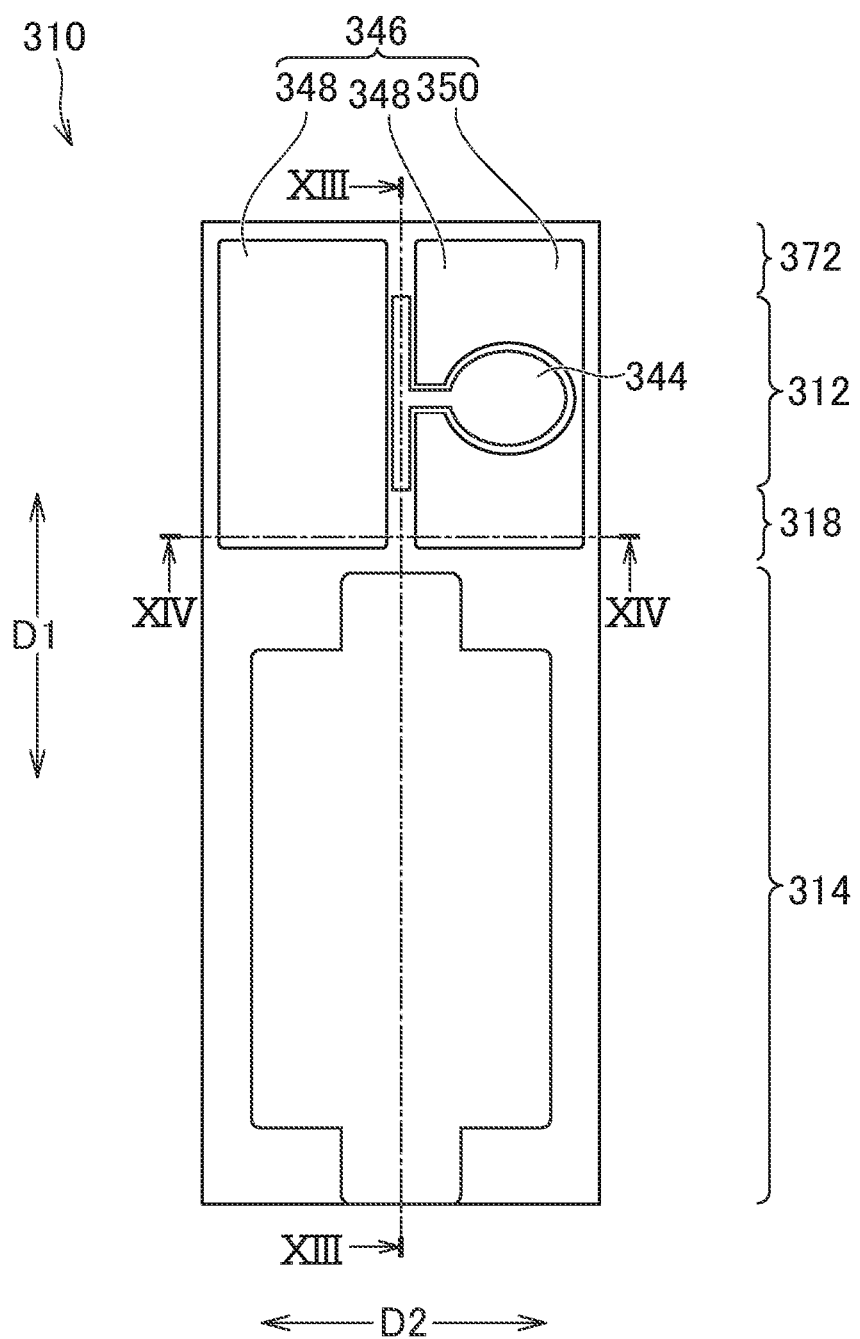
FIG. 12 is a plan view of an example optical semiconductor device described herein.
Figure 13:
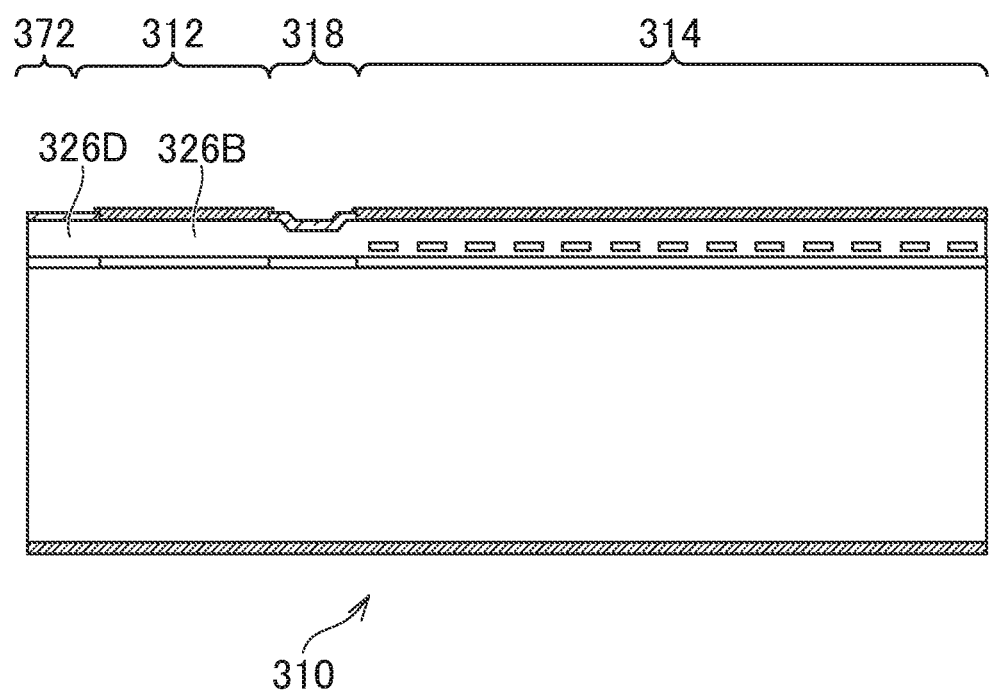
FIG. 13 is a XIII-XIII cross-sectional view of the example optical semiconductor device shown in FIG. 12.
Figure 14:
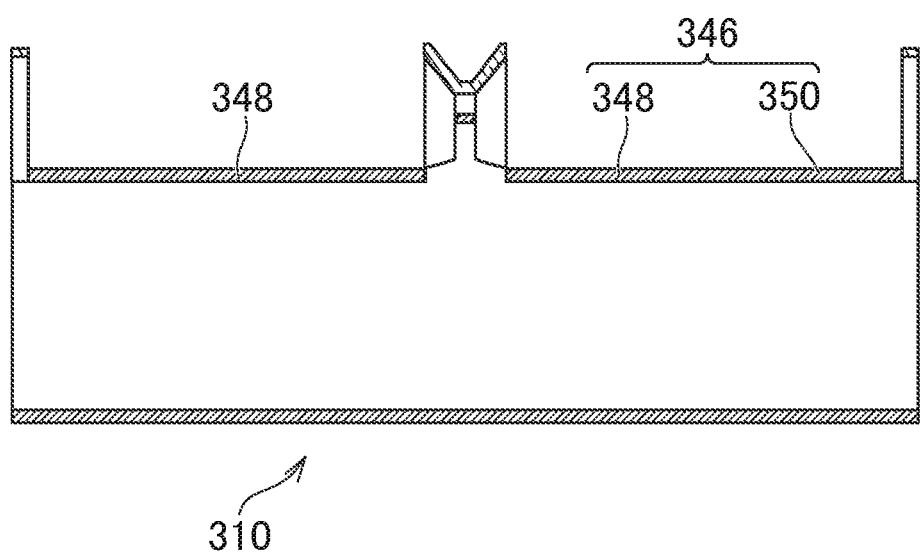
FIG. 14 is a XIV-XIV cross-sectional view of the example optical semiconductor device shown in FIG. 12.

FIG. 12 is a plan view of an example optical semiconductor device. FIG. 13 is a XIII-XIII cross-sectional view of the example optical semiconductor device shown in FIG. 12. FIG. 14 is a XIV-XIV cross-sectional view of the example optical semiconductor device shown in FIG. 12. What is described above in relation to FIGS. 1-11 is applicable to FIGS. 12-14.

An optical semiconductor device 310 may include an outgoing waveguide 372 that extends to be optically connected to a modulator 312 in a direction against a semiconductor laser 314 in a first direction D1. The composition of a connecting waveguide 318 may be applicable to the structure of the outgoing waveguide 372. However, a semiconductor layer 326D of the outgoing waveguide 372 may have the same thickness as a semiconductor layer 326B of the modulator 312. As shown in FIG. 12, a metal film 346 (both a first portion 348 and a second portion 350) may be adjacent to the outgoing waveguide 372. The metal film 346 (both the first portion 348 and the second portion 350) may be adjacent to the connecting waveguide 318.

Figure 15:
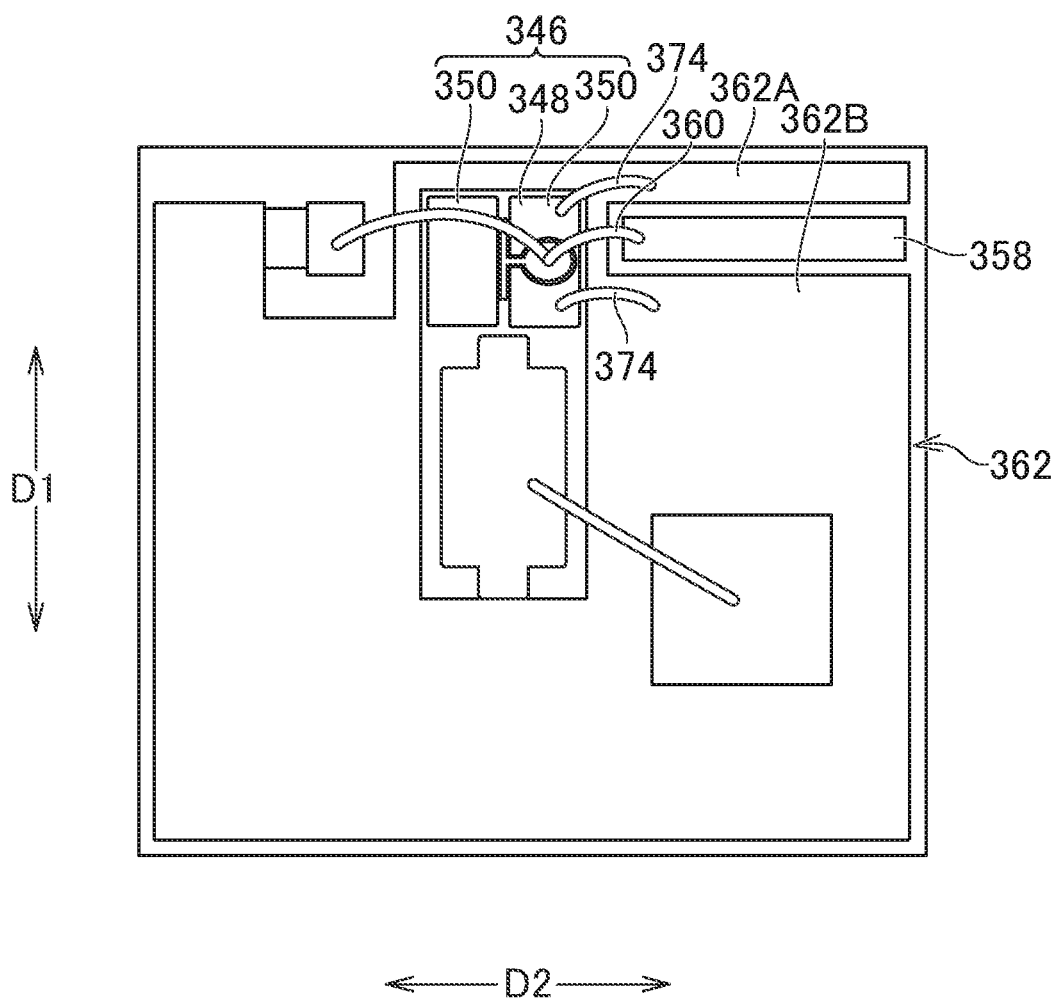
FIG. 15 is a plan view of an example semiconductor light-emitting device described herein.

FIG. 15 is a plan view of an example semiconductor light-emitting device. A ground pattern 362 may include a first ground pattern 362A and a second ground pattern 362B arranged to sandwich a signal line 358. Each of the first ground pattern 362A and the second ground pattern 362B may be connected to the second portion 350 of the metal film 346 with a ground wire 374. Some ground wires 374 may sandwich the first signal wire 360.

In some implementations, the metal film 346 is wide in the first direction D1, whereby the ground wire 374 may be bonded to the metal film 346. A pair of ground wires 374 may have respective first ends bonded at positions, of the ground pattern 362, which may sandwich the signal line 358. Respective second ends of the pair of ground wires 374 may be bonded at positions, of the metal film 346, which may sandwich the pad electrodes 344. This reduces inductance caused by the first signal wire 360.

Figure 16:
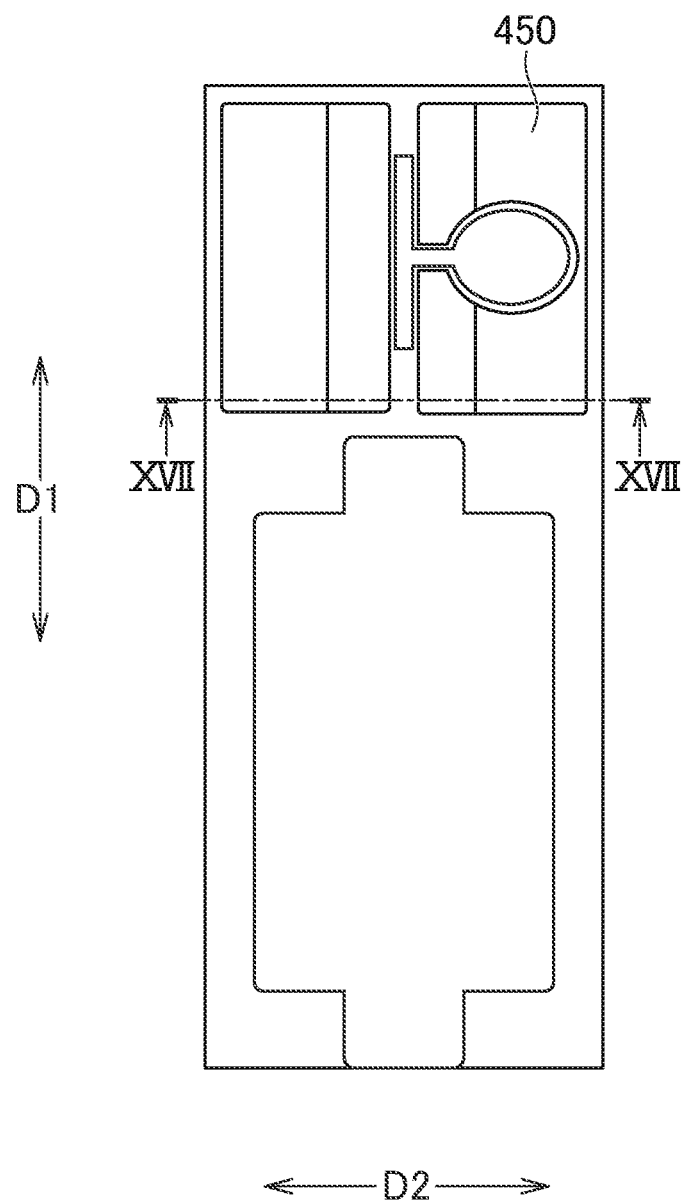
FIG. 16 is a plan view of an example optical semiconductor device described herein.
Figure 17:
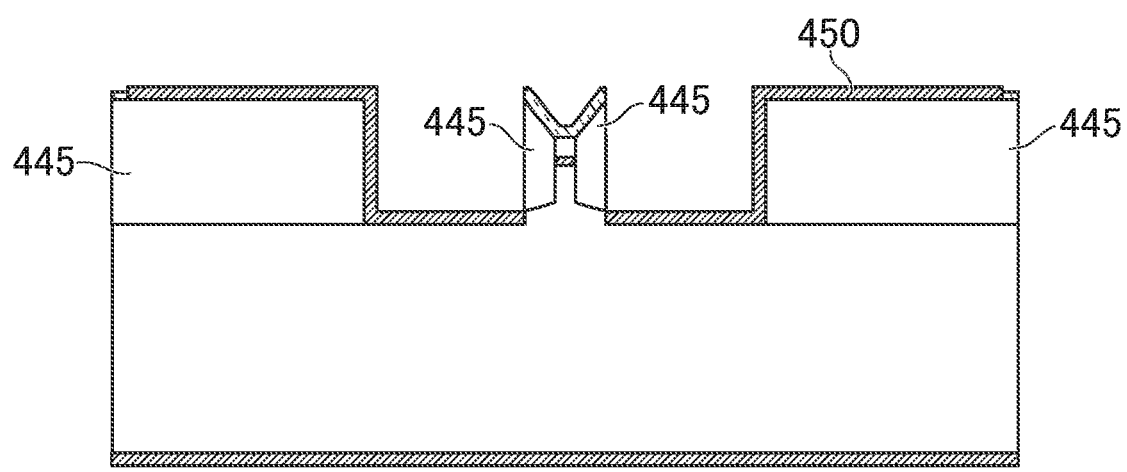
FIG. 17 is a XVII-XVII cross-sectional view of the example optical semiconductor device shown in FIG. 16.
Figure 18:
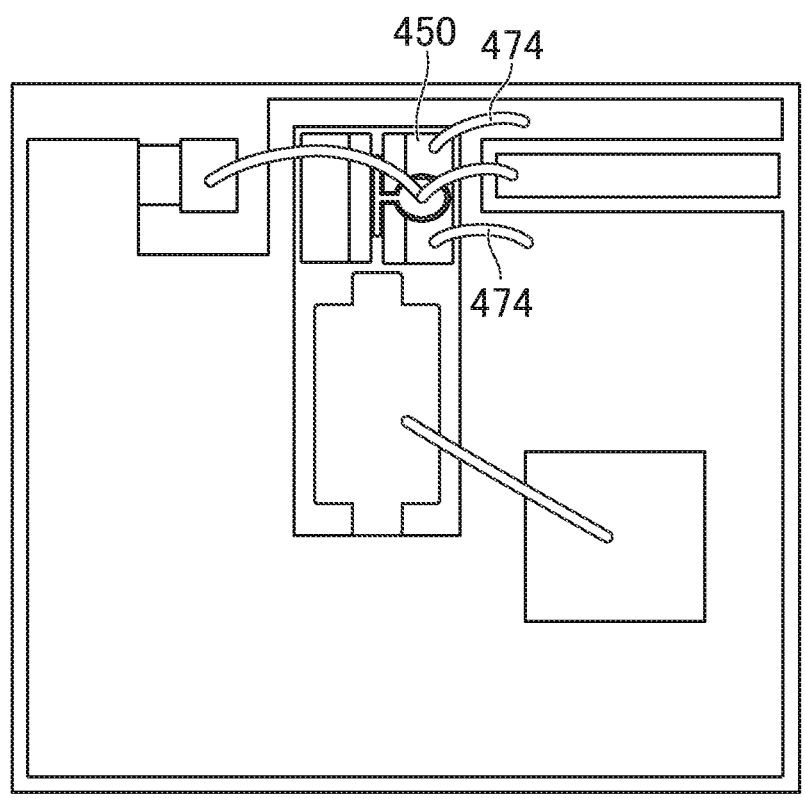
FIG. 18 is a plan view of an example semiconductor light-emitting device described herein.

FIG. 16 is a plan view of an example optical semiconductor device. FIG. 17 is a XVII-XVII cross-sectional view of the example optical semiconductor device shown in FIG. 16. FIG. 18 is a plan view of an example semiconductor light-emitting device. What is described above in relation to FIGS. 1-15 is applicable to FIGS. 16-18.

In some implementations, a second portion 450 may be high and wide due to a semi-insulating semiconductor layer 445 positioned thereunder. Therefore, a ground wire 474 may be easily bonded to the second portion 450.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical semiconductor device comprising:
   a semiconductor substrate with a protrusion,
      wherein the protrusion forms a lower end portion of a mesa stripe structure in a stripe shape extending in a first direction along an optical axis;
   a multi-quantum well layer in a stripe shape extending in the first direction on the protrusion,
      wherein the multi-quantum well layer forms an intermediate portion of the mesa stripe structure;
   a semiconductor layer in a stripe shape extending in the first direction on the intermediate portion,
      wherein the semiconductor layer forms an upper end portion of the mesa stripe structure;
   a semi-insulating semiconductor layer in contact with side surfaces of the mesa stripe structure on both sides in a second direction perpendicular to the first direction;
   a first electrode on a surface, opposite the protrusion, of the semiconductor substrate;
   a second electrode including a mesa electrode on the upper end portion of the mesa stripe structure,
      wherein the second electrode includes a lead-out electrode extending in the second direction from the mesa electrode,
      wherein the second electrode includes a pad electrode connected to the lead-out electrode; and
   a metal film including a first portion positioned on both sides of the lead-out electrode in the first direction and on an upper surface of the semiconductor substrate next to the protrusion in the second direction and not covered by the semi-insulating semiconductor layer,
      wherein the first portion is positioned adjacent to the lead-out electrode and between the pad electrode and the mesa electrode, and
      wherein the metal film includes a second portion positioned next to and not contacting the pad electrode and continuously integrated with at least part of the first portion.

2. The optical semiconductor device of claim 1, wherein the second portion of the metal film is positioned next to the pad electrode in the first direction and the second direction.

3. The optical semiconductor device of claim 1, wherein the semi-insulating semiconductor layer is disposed below the lead-out electrode and the pad electrode.

4. The optical semiconductor device of claim 1, further comprising a resin layer under the lead-out electrode and the pad electrode and over the semiconductor substrate.

5. The optical semiconductor device of claim 1, wherein the semi-insulating semiconductor layer is disposed below at least part of the second portion of the metal film.

6. The optical semiconductor device of claim 1, wherein the semi-insulating semiconductor layer is disposed below at least part of the first portion.

7. The optical semiconductor device of claim 1, wherein the mesa stripe structure forms a modulator.

8. The optical semiconductor device of claim 7, wherein the modulator, a semiconductor laser, and a connecting waveguide configured to optically connect the modulator and the semiconductor laser are monolithically integrated.

9. The optical semiconductor device of claim 8, wherein the first portion is also positioned next to the connecting waveguide.

10. The optical semiconductor device of claim 8, further comprising an outgoing waveguide portion optically connected to the modulator and disposed between the semiconductor laser and the modulator.

11. The optical semiconductor device of claim 10, wherein the first portion is positioned next to the outgoing waveguide portion.

12. The optical semiconductor device of claim 1, wherein the second portion is connected to the first portion.

13. A semiconductor light-emitting device comprising:
   an optical semiconductor device, comprising:
      a semiconductor substrate with a protrusion,
         wherein the protrusion forms a lower end portion of a mesa stripe structure in a stripe shape extending in a first direction along an optical axis;
      a multi-quantum well layer in a stripe shape extending in the first direction on the protrusion,
         wherein the multi-quantum well layer forms an intermediate portion of the mesa stripe structure;
      a semiconductor layer in a stripe shape extending in the first direction on the intermediate portion, wherein the semiconductor layer forms an upper end portion of the mesa stripe structure;
a semi-insulating semiconductor layer in contact with side surfaces of the mesa stripe structure on both sides in a second direction perpendicular to the first direction;
a first electrode on a surface, opposite the protrusion, of the semiconductor substrate;
a second electrode including a mesa electrode on the upper end portion of the mesa stripe structure,
wherein the second electrode includes a lead-out electrode extending in the second direction from the mesa electrode,
wherein the second electrode includes a pad electrode connected to the lead-out electrode; and
a metal film including a first portion positioned on both sides of the lead-out electrode in the first direction and on an upper surface of the semiconductor substrate next to the protrusion in the second direction and not covered by the semi-insulating semiconductor layer,
wherein the first portion is positioned adjacent to the lead-out electrode and between the pad electrode and the mesa electrode, and
wherein the metal film includes a second portion positioned next to and not contracting the pad electrode and continuously integrated with at least part of the first portion; and
a carrier on which the optical semiconductor device is mounted.

14. The semiconductor light-emitting device of claim 13, wherein
the carrier is equipped with a signal line, a ground pattern, and a termination resistor,
the ground pattern is electrically connected to the first electrode of the optical semiconductor device and one end of the termination resistor,
the signal line is electrically connected to the pad electrode of the optical semiconductor device, with a first signal wire configured to extend just above the second portion of the metal film,
the pad electrode of the optical semiconductor device is electrically connected to another end of the termination resistor, with a second signal wire, and
the mesa stripe structure forms a modulator and the termination resistor are connected in parallel.

15. The semiconductor light-emitting device of claim 14, wherein
the ground pattern includes a first ground pattern and a second ground pattern with the signal line interposed therebetween, and
each of the first ground pattern and the second ground pattern are connected to the second portion of the metal film, with a ground wire.

16. The semiconductor light-emitting device of claim 13, wherein the semi-insulating semiconductor layer is disposed below the lead-out electrode and the pad electrode.

17. The semiconductor light-emitting device of claim 13, wherein a resin layer is positioned under the lead-out electrode and the pad electrode and over the semiconductor substrate.

18. The semiconductor light-emitting device of claim 13, wherein the semi-insulating semiconductor layer is disposed below at least part of the first portion.

19. The semiconductor light-emitting device of claim 13, wherein the semi-insulating semiconductor layer is disposed below at least part of the second portion of the metal film.

20. The semiconductor light-emitting device of claim 13, wherein the mesa stripe structure forms a modulator, and
wherein an outgoing waveguide is optically connected to the modulator and disposed between a semiconductor laser and the modulator.

* * * * *